(12) United States Patent
Chu et al.

(10) Patent No.: US 12,132,451 B2
(45) Date of Patent: Oct. 29, 2024

(54) CURRENT TRACKING BULK VOLTAGE GENERATOR

(71) Applicant: Micron Technology, Inc., Boise, ID (US)

(72) Inventors: Wei Lu Chu, Pudong (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 488 days.

(21) Appl. No.: 17/583,018

(22) Filed: Jan. 24, 2022

(65) Prior Publication Data

US 2023/0253928 A1    Aug. 10, 2023

(51) Int. Cl.
| | |
|---|---|
| H03F 1/30 | (2006.01) |
| G11C 11/4074 | (2006.01) |
| H02M 3/155 | (2006.01) |
| H03F 1/02 | (2006.01) |
| H03F 3/21 | (2006.01) |

(52) U.S. Cl.
CPC .......... *H03F 1/301* (2013.01); *G11C 11/4074* (2013.01); *H02M 3/155* (2013.01); *H03F 1/0233* (2013.01); *H03F 3/211* (2013.01); *H03F 2200/504* (2013.01)

(58) Field of Classification Search
CPC ........ H03F 1/301; H03F 1/0233; H03F 3/211; H03F 2200/504; G11C 11/4074
See application file for complete search history.

(56) References Cited

U.S. PATENT DOCUMENTS

| | | | | |
|---|---|---|---|---|
| 5,686,823 A | * | 11/1997 | Rapp | G05F 3/267 323/315 |
| 7,639,067 B1 | * | 12/2009 | Perisetty | G05F 1/56 326/41 |
| 2006/0125563 A1 | * | 6/2006 | Elder | H03F 1/301 330/253 |
| 2010/0321096 A1 | * | 12/2010 | Sudjian | H03F 3/19 327/530 |
| 2019/0101947 A1 | * | 4/2019 | Mercier | G05F 3/24 |
| 2021/0293083 A1 | * | 9/2021 | Tarng | F24F 11/89 |

\* cited by examiner

*Primary Examiner* — Patricia T Nguyen
(74) *Attorney, Agent, or Firm* — Fletcher Yoder, P.C.

(57) ABSTRACT

Systems and devices are provided for tracking bandgap current generated by a bandgap circuit and mitigation of leakage current regardless of variations in PVT conditions. An apparatus may include one or more power amplifiers that powers components of the apparatus and comprising a transistor. The apparatus may also include bandgap current mirroring circuitry that generates a mirrored current that mirrors a received current that is process, voltage, and temperature (PVT) independent. The apparatus may also include a bulk voltage generator circuit including an amplifier having an input coupled to the bandgap current mirroring circuitry. Bulk voltage control circuitry is coupled to an output of the amplifier and generates a bulk voltage based on the relationship between the mirrored current and the leakage current.

20 Claims, 5 Drawing Sheets

CURRENT TRACKING BULK VOLTAGE GENERATOR

BACKGROUND

Field of the Present Disclosure

Embodiments of the present disclosure relate generally to voltage generation for bulk terminals in electronic devices. For example, a bulk voltage generation circuit may be used to track bandgap current and control operation of bulk voltage generators to mitigate leakage current from one or more transistors (e.g., PMOS).

Description of the Related Art

Various operations in a memory device and/or other electronic devices may rely on power amplifiers that utilize one or more transistors. For example, the one or more transistors may include p-channel metal oxide semiconductor (PMOS) transistors and/or n-channel metal oxide semiconductor (NMOS) transistors. The power amplifiers may utilize the one or more transistors to provide a relatively large current (e.g., 1 mA) for the memory device and/or electronic device. However, the one or more transistors may leak some current during standby modes. For instance, the one or more transistors may leak switch-off currents (Ioff) when the one or more transistors are turned off. This leakage current increases power consumption and may result in unwanted electrical behavior.

In some embodiments, bulk terminals of one or more transistors may be connected to corresponding source terminals, thus providing the source voltage to the bulk terminal via the connection between the source and bulk terminals. However, a bulk voltage generation circuit may be used to provide a constant (e.g., fixed) bulk voltage (Vb) to the bulk terminals to adjust the threshold voltage of the one or more transistors without relying on voltage from the source terminals. As such, the one or more transistors may be reverse biased by increasing the threshold voltage by adjusting the bulk voltage, thereby reducing the leakage current magnitude when the one or more transistors are turned off.

However, the leakage current magnitude may vary with variations in voltage applied to the transistors, current flowing through the transistors, environmental temperature, and the like. In other words, variations in process, voltage, temperature (PVT) conditions may cause variations in the leakage current magnitude. It should be appreciated that while the present disclosure makes reference to a PMOS, any circuit components (e.g., N-channel metal-oxide semiconductor (NMOS)) that may be used in the bulk voltage generation circuit are contemplated in the present disclosure Embodiments of the present disclosure may be directed to one or more of the problems set forth above.

BRIEF DESCRIPTION OF DRAWINGS

Various aspects of this disclosure may better be understood upon reading the following detailed description and upon reference to the drawings in which.

DETAILED DESCRIPTION

One or more specific embodiments will be described below. To provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Electronic devices, such as semiconductor devices, memory chips, microprocessor chips, image chips, and the like, may include circuitry that performs various operations based on a provided voltage and current. In some instances, the voltage and current provided to the circuitry may be cut-off when the semiconductor device enters a standby mode and/or a powered down mode (e.g., turn-off mode), for example, to reduce battery consumption. During turn-off current may still flow in portions of the circuitry due to physical attributes of circuit components. This current may result in unwanted electrical behavior such as charging of portions of the circuitry and/or waste of electrical power.

The present disclosure generally relates to electronic devices that employ power amplifiers to power portions of the electronic device and a bulk voltage generation circuit to mitigate leakage current generated by the power amplifiers. Generally, electronic devices may include one or more power operational amplifiers that generate an amplified output to drive circuitry within the electronic device. For example, semiconductor devices, such as high bandwidth memory (HBM) devices, may include many high-gain power amplifiers to provide high-magnitude operation current to the rest of the semiconductor device. Each power amplifier may include one or more p-channel metal oxide semiconductor (PMOS) transistors that each generate a large current output to provide the high-magnitude operation current.

When the semiconductor device enters a standby mode and/or a powered down mode (e.g., to reduce battery consumption), the power amplifiers may be disabled. In particular, gate terminals of the PMOSs may be coupled (e.g., pulled up) to an external voltage source (e.g., drain-to-drain voltage (VDD) while a peripheral voltage (VPERI)) is used to drive a source terminal of the PMOSs. Once the gate terminal and the source terminal of the PMOS are at nearly equivalent voltages, the PMOS will be effectively off as the voltage difference between the gate terminal and the source terminal (e.g., Vgs) is no longer below an operating voltage threshold. That is, because the potential at the terminals is no longer large enough to drive carriers, active current will not flow through the PMOS.

However, even when the PMOS is effectively off, leakage current may still flow through the transistor. In particular, due to non-ideal behavior of the PMOS, unwanted current may flow through the PMOS device. For example, the leakage current may include current that flows due to formation of a reverse bias between diffusion regions and wells of the PMOS when the PMOS is turned-off (e.g., junction leakage). As another example, the leakage current may include current that flows between a drain terminal and the source terminal of the PMOS due to scaling of the supply voltage at the source terminal with transistor size (e.g., subthreshold conduction). Additionally or alternatively, the leakage current may include current that flows between the terminals due to a breakdown of a dielectric layer at the gate terminal (e.g., gate-oxide leakage).

Regardless, the leakage current magnitude may vary with variations in voltage applied to the PMOS, current flowing through the PMOS, environmental temperature, and the like. In other words, variations in process, voltage, temperature (PVT) conditions may cause variations in the current magnitude. It should be appreciated that while the present disclosure makes reference to a PMOS, any suitable circuit components (e.g., N-channel metal-oxide semiconductor (NMOS) using different polarity connections to its gate terminal) that may be used in the bulk voltage generation circuit are contemplated in the present disclosure.

As previously discussed, a bulk voltage generation circuit may be used to adjust the threshold voltage of one or more transistors and reduce the leakage current through the one or more transistors. In some instances, the bulk voltage generation circuit may use an operational amplifier to provide a constant (e.g., fixed) bulk voltage (Vb) to the bulk terminal to reduce the leakage current. Additionally, the bulk voltage magnitude may be greater than the external voltage source (e.g., VDD, VPERI) provided to the source terminal. However, because the leakage current magnitude may vary with variations in process, voltage applied to the transistors, current flowing through the transistors, environmental temperature, and the like, as described above, the constant voltage amount techniques, which cannot track the changes in the leakage current, may not adequately reduce the leakage current for all testable PVT conditions.

Additionally or alternatively, because the constant voltage amount techniques may increase the threshold voltage of the transistors, the performance of the semiconductor device may be adversely affected. For example, slow (SS) corners may have different ideal threshold voltages when compared to fast (FF) corners. However, setting the threshold voltage for all corners to accommodate slow corners may result in decreased performance speed, additional power consumption, lower current, increased leakage for other corners, and/or other undesirable factors, for the semiconductor device. In some instances, the semiconductor device may include a bandgap circuit to provide voltages and current independent of process variations, power supply variations, temperature changes, and the like. In other words, the bandgap current and voltages may be independent of PVT condition variations, but the power amplifiers receiving such voltages and currents may still be subject to PVT variations if not addressed.

Accordingly, the present disclosure provides systems and techniques for mitigating leakage current across various PVT conditions, including corner cases, by using a bulk voltage generation circuit that tracks the bandgap current. In some embodiments, the bulk voltage generation circuit may include an operational amplifier that facilitates tracking the bandgap current and mitigating the leakage current. Additional details with regard to leakage current across variations in PVT conditions will be described below with reference to FIGS. 1-5.

Figure 1:
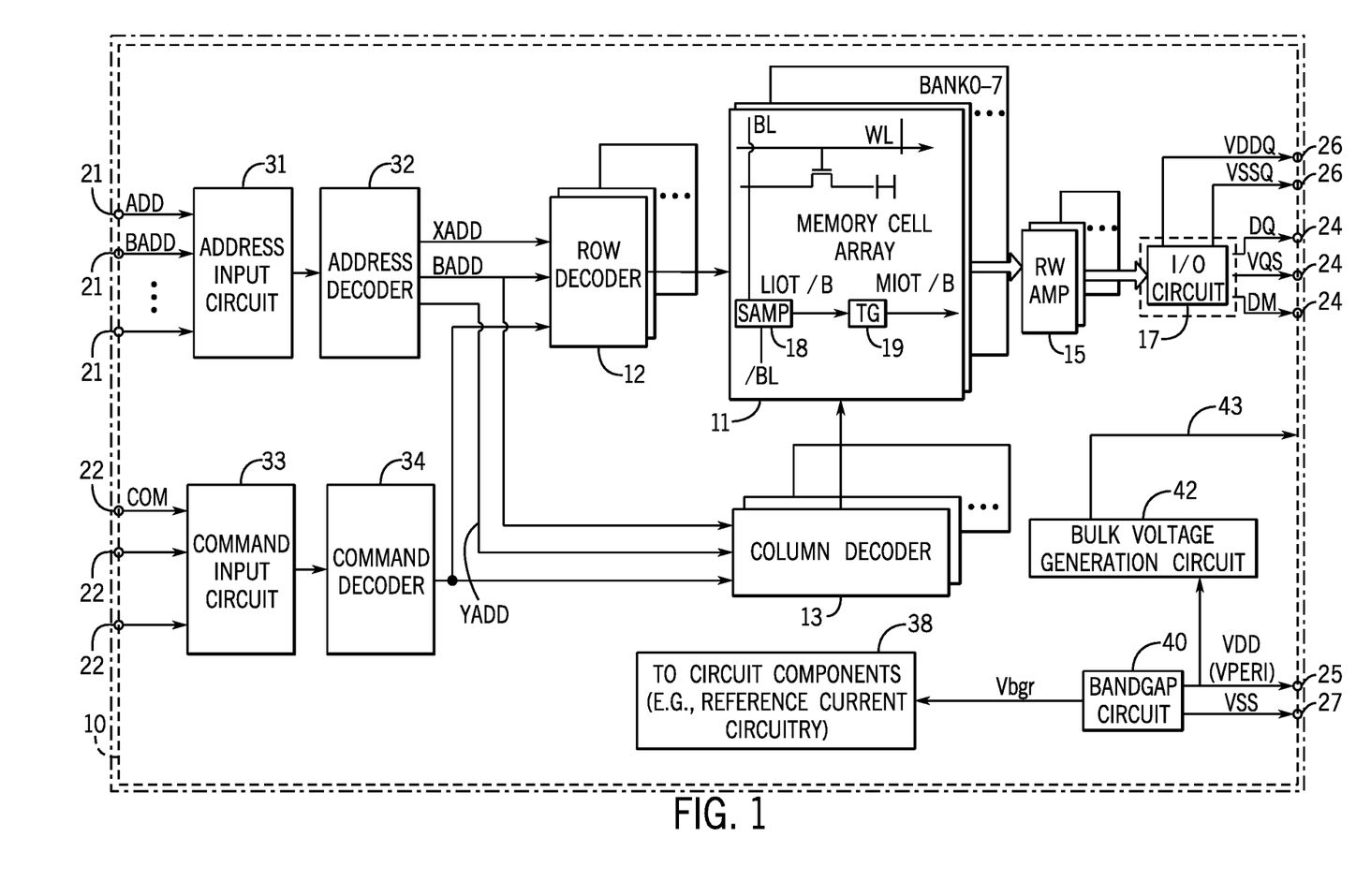
FIG. 1 is a simplified block diagram illustrating a semiconductor device that includes a bulk voltage generation circuit, in accordance with an embodiment of the present disclosure.

With this in mind, FIG. 1 illustrates a semiconductor device 10 that includes a bulk voltage generation circuit 42, in accordance with an embodiment of the present disclosure. Although the following description of the semiconductor device 10 will be described in the context of a memory device, it should be noted that the embodiments described herein may be employed for any suitable electronic device. Indeed, the description of the memory device below is provided to explain certain aspects of the bulk voltage generation circuit 42 of the present disclosure, and, as such, the embodiments described herein should not be limited to memory devices.

The semiconductor device 10 may be any suitable memory device, such as a low power double data rate type 4 (LPDDR4) synchronous dynamic random-access memory (SDRAM) integrated onto a single semiconductor chip, a low power double data rate type 5 (LPDDR5), double data rate type 4 (DDR4), double data rate type 5 (DDR5), a high bandwidth memory (HBM) device, or other electronic device that may utilize the bulk voltage generation circuit 42 to reduce leakage current. The semiconductor device 10 may be mounted on an external substrate 2, such as a memory module substrate, a motherboard, and the like. The semiconductor device 10 may include any number of memory banks each having a number of memory cell arrays 11. Each memory cell array 11 may include any number of word lines WL, any number of bit lines BL, and any number of memory cells MC arranged at intersections of the word lines WL and the bit lines BL. The selection of the word line WL is performed by a row decoder 12 and the selection of the bit line BL is performed by a column decoder 13. Sense amplifiers (SAMP) 18 are coupled to corresponding bit lines BL and connected to local input/output (I/O) line pairs LIOT/B. Local IO line pairs LIOT/B are connected to main IO line pairs MIOT/B via transfer gates (TG) 19, which function as switches to control signal flow.

The semiconductor device 10 may also include any number of external terminals, which may communicate with other electrical components/devices. The external terminals may, in turn, include address terminals 21, command terminals 22, data terminals 24, and power supply terminals 25 (e.g., VDD, VPERI), 26 (e.g., VDDQ, VSSQ). In particular, the address terminals 21 receive an address signal ADD and a bank address signal BADD. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder 12 as well as a decoded column address signal YADD to the column decoder 13. The address decoder 32 also receives the bank address signal BADD and supplies the bank address signal BADD to the row decoder 12 and the column decoder 13.

The command terminals 22 receive a command signal COM. The command signal COM may include one or more separate signals. The command terminals 22 transfer the command signal COM to a command decoder 34 via the command input circuit 33. The command decoder 34 decodes the command signal COM to generate various internal command signals. For example, the internal commands may include a row command signal to select a word line WL and a column command signal, such as a read command or a write command, to select a bit line BL. Additionally, the data terminals 24 may be coupled to output buffers for read operations of memories or to input buffers for read/write access of the memories.

Although the address terminals 21 and the command terminals 22 are illustrated as separate terminals, it should be appreciated that in some embodiments, the address input circuit 31 and the command input circuit 33 may receive address signals ADD and command signals COM via the same terminal. For instance, the address and command terminals may provide an address signal at a falling clock edge (e.g., in synchronism with clock falling edge) and a command signal at a rising clock edge (e.g., in synchronism with clock rising edge). Further, the data terminals 24 may also be a single terminal that alternatively receives data signals (DQ, DQS, DM).

Accordingly, the address signals ADD. BADD and the command signals COM may be used to access a memory cell MC in the memory cell array 11. As an example, when a command signal COM indicating a read operation is timely supplied to a word line WL and a bit line BL designated by a respective row address and column address of the address signal ADD, data may be read from the memory cell MC associated with the row address and column address. The read data DQ may be output externally from the data terminals 24 via a read/write amplifier 15 and an input/output circuit 17. Similarly, when a command signal COM indicating a write operation is timely supplied to a word line WL and a bit line BL designated by a respective row address and column address of the address signal ADD, data DQ may be written to the memory cell MC associated with the row address and column address. The write data DQ may be supplied to the memory cell MC after being received from the data terminals 24, the input/output circuit 17, and the read/write amplifier 15.

In some embodiments, the input/output circuit 17 may include input buffers that store data for processing and/or transmission. Further, the input/output circuit 17 receives a timing signal from an external clock that controls input timing of read data DQ and output timing of write data DQ. The input/output circuit 17 may be powered using dedicated power supply potentials VDDQ and VSSQ, such that power supply noise generated by the input/output circuit 17 does not propagate to the other circuit blocks. The power supply potentials VDDQ and VSSQ may be of the same potentials as power supply potentials VDD and VSS that are supplied to power supply terminals 25, 27 respectively.

In particular, the power supply potentials (e.g., VDD. VPERI, VSS) may be supplied to a bandgap circuit 40. In some embodiments, the bandgap circuit 40 may output a constant (e.g., fixed) voltage ($V_{bgr}$) independent of process variations (e.g., circuit loading), power supply variations, temperature changes, and the like. In other words, the $V_{bgr}$ voltage may be independent of PVT condition variations. Additionally or alternatively, the bandgap circuit 40 may output a constant (e.g., fixed) current (Iptat) independent of process variations, power supply variations, temperature changes, and the like. In other words, the Iptat current may be independent of PVT condition variations. The bandgap circuit 40 may generate various internal potentials VPP, VOD, VARY that are provided to circuit elements of the semiconductor device 10. For example, the internal potential VPP may be mainly used in the row decoder 12 and the reference current circuitry 38 and the internal potentials VOD and VARY may be mainly used in the sense amplifiers 18 included in the memory cell array 11.

The power supply potential may also be supplied to a bulk voltage generation circuit 42 that facilitates tracking of leakage current, mirroring the Iptat current, and generating bulk voltage 43 to reduce the leakage current magnitude within the semiconductor device 10. For example, the semiconductor device 10 may include multiple power amplifiers that in turn include transistors, such as PMOS transistors. The PMOS transistors may generate a leakage current when the semiconductor device 10 is in a turned-off mode due to transistor physical properties. The leakage current may impact voltages in portions of the circuitry of the semiconductor device 10 thereby reducing performance of the semiconductor device 10, lifespan of the circuit components, and/or negatively impacting power consumption for the semiconductor device 10. As such, the bulk voltage generation circuit 42 may be used to generate the bulk voltage 43 to reduce the leakage current magnitude. In some embodiments, the bulk voltage generation circuit 42 may transmit the bulk voltage 43 to one or more transistors within the semiconductor device 10 via routing (e.g., trace routing and/or edge routing).

Figure 2:
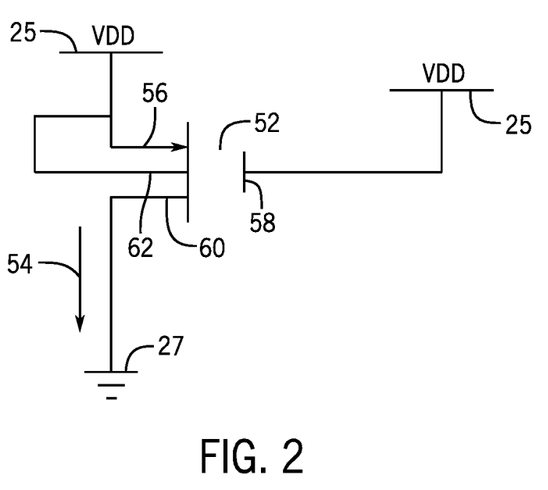
FIG. 2 is a schematic diagram of a metal-oxide semiconductor (MOS) transistor, in accordance with an embodiment of the present disclosure.

FIG. 2 illustrates a schematic diagram of a PMOS transistor 52 that generates a leakage current 54, in accordance with an embodiment of the present disclosure. As discussed above, the PMOS transistor 52 may generate the leakage current 54 during turn-off modes. In particular, in a turn-off mode, the amplifiers may be disabled by coupling a PMOS source terminal 56 and a PMOS gate terminal 58 to the power supply terminal 25. Additionally, a drain terminal 60 may be tied to another voltage (e.g., 0 V, ground, VSS, etc.) and a bulk terminal 62 may be coupled to the source terminal 56 and thereby the power supply potential. However, due to physical properties of the PMOS transistor 52, a relatively large leakage current (e.g., up to 300 µA) may flow at the drain terminal 60 even when the PMOS transistor 52 is off.

Figure 3:
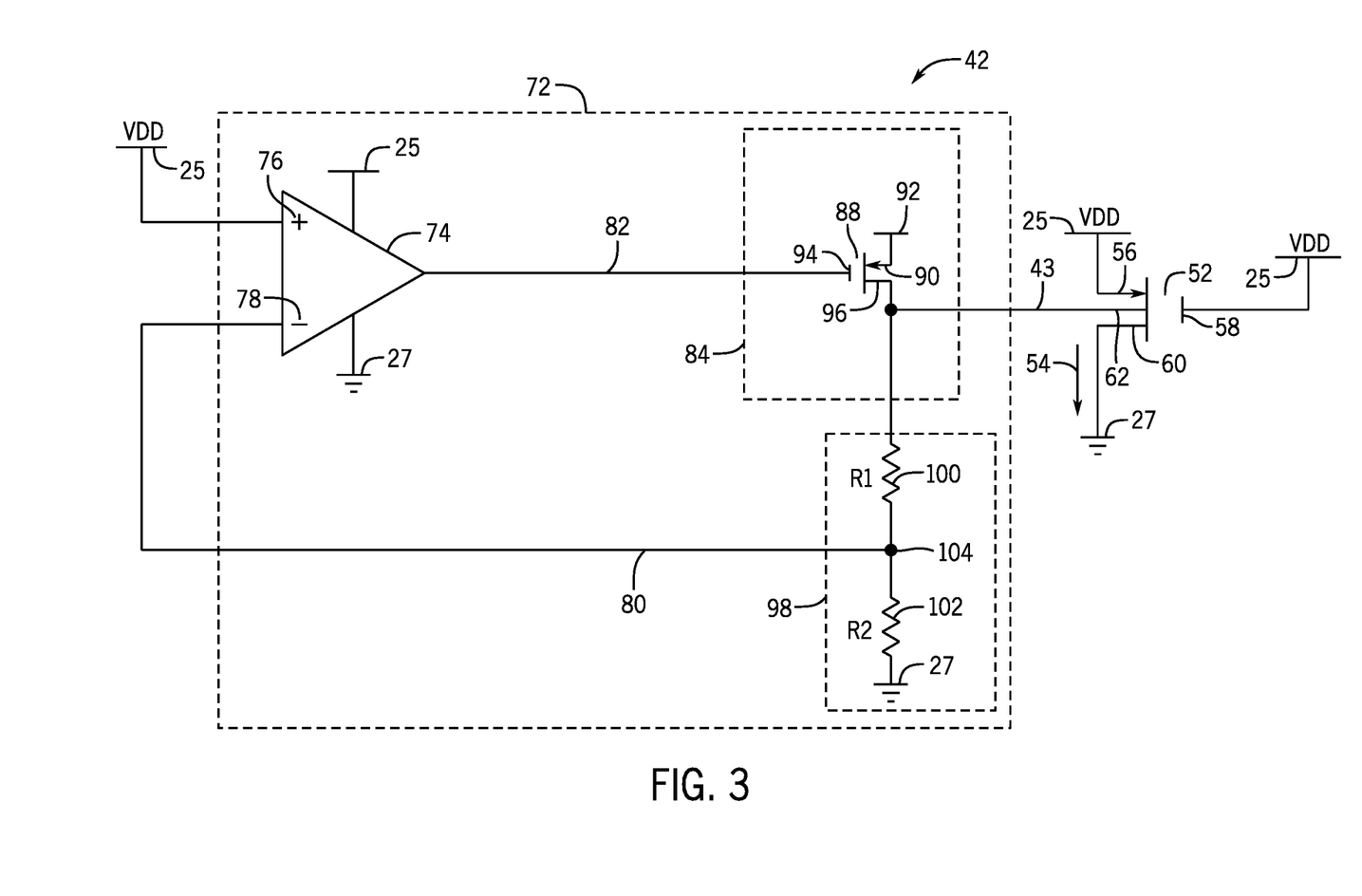
FIG. 3 is a schematic diagram of the bulk voltage generation circuit, in accordance with an embodiment of the present disclosure.

FIG. 3 illustrates a schematic diagram of an example embodiment of a bulk voltage generation circuit 42 that may generate a constant (e.g., fixed) bulk voltage 43 to supply to a bulk terminal of the PMOS 52, in accordance with an embodiment of the present disclosure. The bulk voltage generation circuit 42 may include voltage generator circuitry 72, including an amplifier 74 that is driven (e.g., powered) using the power supply potential provided by the power supply terminal 25 and generated external to the semiconductor device 10. Using the power supply potential to drive the amplifier 74 as opposed to using an internally generated power supply potential, such as VPP, may enhance power savings as the power supply potential is generally of a lower voltage level than the internally generated power supply potentials.

The amplifier 74 may receive the power supply potential at, for example, a positive input terminal 76 of the amplifier 74. In some embodiments, the power supply potential may be received at a negative input terminal 78 of the amplifier 74. Further, the amplifier 74 may also receive a feedback voltage ($V_{fb}$) 80 at the remaining input terminal, which in the illustrated embodiment, is the negative input terminal 78 of the amplifier 74. An output 82 of the amplifier 74 may be coupled to a PMOS unit 84 that provides the bulk voltage 43 for the PMOS transistor 52. The PMOS unit 84 may include a PMOS transistor 88 with a source terminal 90 tied to a power supply potential 92 (e.g., VDD1), a gate terminal 94 tied to the output 82, and a drain terminal 96 tied to a voltage divider 98 and the bulk terminal 62 of the PMOS transistor 52. In some embodiments, the power supply potential 92 may be greater than the power supply potential provided by the power supply terminal 25. For example, the power supply potential 92 may be greater than VDD some amount (e.g., 0.1-0.9 volts). For instance, this difference in VDD and the power supply potential 92 may be equal to or greater than the threshold voltage of the PMOS transistor 88.

The negative input terminal 78 may be coupled to the voltage divider 98 that divides the bulk voltage 43 to generate Vfb 80. For example, the voltage divider 98 includes a first resistor 100 and a second resistor 102. A resistance value, R1, of the first resistor 100 and/or a resistance value, R2, of the second resistor 102 may be selected to provide a constant (e.g., fixed) bulk voltage 43 at a desired value (e.g., 1.0-1.9 volts) to set the ratio between the bulk voltage 43 and Vfb 80. Because of the amplifier structure and the voltage divider 98, a node 104 coupling an output of the voltage divider 98 and the negative input terminal 78 may have a potential that is the same as the power supply potential provided by the power supply terminal 25. That is, the feedback voltage (Vfb) 80 may have the same potential as VDD. If Vfb 80 varies from VDD, the amplifier 74 may correct such fluctuations.

As such, by having the output 82 coupled to the gate terminal 94 and the voltage divider 98 tied to the drain terminal 96, the voltage generation circuitry 72 may function as a voltage regulator to generate a constant (e.g., fixed) bulk voltage 43 for the bulk terminal 62 of the PMOS transistor 52. However, and as discussed above, the PMOS transistors of an amplifier may generate the leakage current 54 that may vary with variations in process, voltage applied to the transistors, current flowing through the transistors, environmental temperature, and the like. As such, the constant voltage amount techniques, which cannot track the changes in the leakage current 54, may not adequately reduce the leakage current 54 for all testable PVT conditions for different process corners. Additionally or alternatively, because the constant voltage amount techniques may increase the threshold voltage of the transistors, the performance of the semiconductor device may be adversely affected for at least some corners. For example, slow (SS) corners may have different ideal threshold voltages when compared to fast (FF) corners. However, setting the threshold voltage for all corners to accommodate slow corners may result in decreased performance speed, additional power consumption, lower current, increased leakage for other corners, and/or other undesirable factors, for the semiconductor device.

Figure 4:
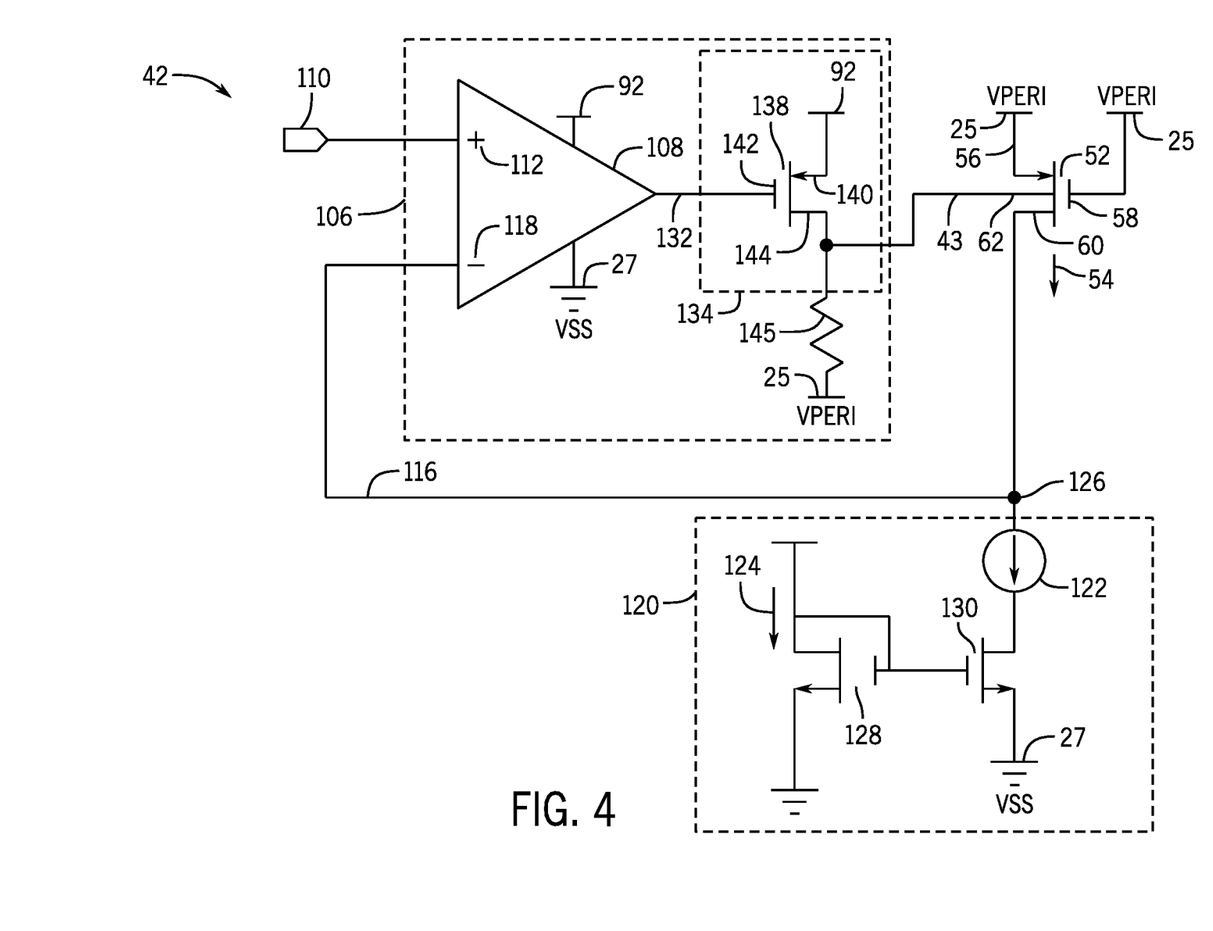
FIG. 4 is another schematic diagram of the bulk voltage generation circuit, in accordance with an embodiment of the present disclosure.

FIG. 4 illustrates a schematic diagram of another example embodiment of the bulk voltage generation circuit 42 that may facilitate tracking the leakage current 54 due to PVT variations, in accordance with an embodiment of the present disclosure. The bulk voltage generation circuit 42 includes voltage generator circuitry 106, including an amplifier 108 that is driven (e.g., powered) using the power supply potential 92 generated external to the semiconductor device 10. The amplifier 108 may receive a reference voltage 110 as an input into, for example, a positive input terminal 112 of the amplifier 108. In some embodiments, the reference voltage 110 may be received at a negative input terminal 114 of the amplifier 108. The reference voltage 110 may be less than the power supply potential provided by the power supply terminal 25 and/or less than the power supply potential 92. For example, the reference voltage 110 may be less than 1 volt (e.g., 0.9 volts, 0.8 volts, 0.7 volts). Further, the amplifier 108 may also receive a feedback voltage 116 at the remaining input terminal, which in this case, is the negative input terminal 118 of the amplifier 108. The negative input terminal 118 may be coupled to a current mirror 120 (e.g., bandgap current mirroring circuitry) that has a mirrored current 122 that mirrors (e.g., tracks/mimics) a current 124 (e.g., received current. Iptat) received from the bandgap circuit 40 that is independent of process variations, power supply variations, temperature changes, and the like. As such, the mirrored current 122 mirroring the current 124 may also be independent of PVT condition variations. The current mirror 120 may include an NMOS transistor 128 with a source terminal tied to the power supply terminal 25 and a drain terminal tied to another voltage (e.g., 0V, VSS, ground).

As such, by having the mirrored current 122 mirror the current 124 generated by the bandgap circuit 40, the mirrored current 122 may be independent of PVT condition variations. The current mirror 120 may also include an NMOS transistor 130 with a gate terminal tied to the gate terminal of the NMOS transistor 128 and a drain terminal tied to a common return (e.g., 0V, VSS, ground). A node 126 may be coupled to the source terminal of the NMOS transistor 130, may be coupled to the negative input terminal 118 of the amplifier 108, and/or may be coupled the drain terminal 60 of the PMOS transistor 52. The node 126 may provide the feedback voltage 116 to the negative input terminal 118 of the amplifier 108 based on a relationship between the mirrored current 122 and the leakage current 54. Additionally or alternatively, the bulk voltage generation circuit 42 may generate the bulk voltage 43 based on a relationship between the mirrored current 122 and the leakage current 54. For example, if the mirrored current 122 is less than the leakage current 54, the excess current increases the feedback voltage 116. Accordingly, the amplifier 108 increases a voltage level of its output 132 due to the increase in the feedback voltage 116 above the reference voltage 110. As another example, if the mirrored current 122 is greater than the leakage current 54, more charge leaves the node 126 via the mirrored current 122 than enters it via the leakage current 54 causing the feedback voltage 116 to decrease. As such, the amplifier 108 decreases the voltage level of its output 132 due to the decrease in the feedback voltage 116 below the reference voltage 110. If the mirrored current 122 is the same as the leakage current 54, the feedback voltage 116 remains similar to the reference voltage and, the output 132 remains unchanged.

The output 132 of the amplifier 108 may be coupled to bulk voltage control circuitry 134 that provides the bulk voltage 43 for the PMOS transistor 52. The bulk voltage control circuitry 134 generates the bulk voltage 43 based on the relationship between the mirrored current 122 and the leakage current 54. The bulk voltage control circuitry 134 may include a PMOS transistor 138 with a source terminal 140 tied to the power supply potential 92, a gate terminal 142 tied to the output 132, and a drain terminal 144 tied to the power supply terminal 25 via a resistor 145. The drain terminal 144 is also tied to a bulk terminal 64 of the PMOS transistor 52. In some embodiments, the power supply potential 92 may be greater than the power supply potential provided by the power supply terminal 25.

As such, by having the output 132 coupled to the gate terminal 142, the source terminal 140 tied to the power supply potential 92, and the drain terminal 144 tied to the power supply terminal 25, the voltage generator circuitry 106 may function as a voltage regulator to generate varying (e.g., non-fixed) voltage levels for the bulk voltage 43 for the bulk terminal 62 of the PMOS transistor 52. For example, the voltage generator circuitry 106 may provide the bulk voltage 43 in a voltage range between and including the power supply potential provided by the power supply terminal 25 and the power supply potential 92.

In operation, the voltage generator circuitry 106 may generate the bulk voltage 43 based on a relationship between the leakage current 54 and the mirrored current 122. For example, when the leakage current 54 is less than the mirrored current 122, the feedback voltage 116 is pulled down lower (e.g., 0V) than the reference voltage 110. Accordingly, the amplifier 108 functions similar to a comparator and compares the potential (e.g., reference voltage 110) at the positive terminal 112 to the potential (e.g., feedback voltage 116) at the negative terminal 118. As such, since the reference voltage 110 is greater than the feedback voltage 116, the voltage level of the output 132 can be increased to at or near the power supply potential 92. This elevated level for the output 132 provided to the gate terminal 142 shuts down the PMOS transistor 138. As such, the power supply potential provided by the power supply terminal 25 is provided as the bulk voltage 43 to the bulk terminal 62 of the PMOS transistor 52. Similarly to FIG. 2, in this scenario (e.g., leakage current 54<mirrored current 122, leakage current 54<current 124), the bulk terminal 62 receives the same power supply potential as the source terminal 56. As such, power consumption of the semiconductor device 10 may be reduced when the leakage current 54 is relatively small (e.g., less than the current 124) since a large bulk voltage is not unnecessarily used.

In another scenario, the leakage current 54 may be at or approximately equal to the mirrored current 122. As such, the feedback voltage 116 may be the same level as the reference voltage 110. Accordingly, the amplifier 108 provides the output 132 at a voltage level at or less than the difference between the power supply potential 92 and the threshold voltage of the PMOS transistor 138. As such, the output 132 may turn on the PMOS transistor 138 to provide the bulk voltage 43 to the bulk terminal 62 at a potential between the power supply potential 92 and the power supply potential provided by the power supply terminal 25. As a result, the threshold voltage of the PMOS transistor 52 may be adjusted, and the leakage current 54 may be decreased. For example, the leakage current 54 may be decreased to substantially match (e.g., be within 0.2 mA of) the mirrored current 122.

In yet another scenario, when the leakage current 54 is substantially greater (e.g., more than 0.1 mA greater) than the mirrored current 122, the feedback voltage 116 is pulled up to the power supply potential provided by the power supply terminal 25. Accordingly, the amplifier 108 functions similar to a comparator. As such, since the power supply potential at the negative input terminal 118 is greater than the analog reference voltage 110 at the positive input terminal 112, the output 132 is at a low voltage, such as 0 V. The output 132 turns on the PMOS transistor 138 and the power supply potential 92 is provided as the bulk voltage 43 to the bulk terminal 62 of the PMOS transistor 52. As a result, the threshold voltage of the PMOS transistor 52 may be adjusted and the leakage current 54 may be decreased. For example, the leakage current 54 may be decreased towards the mirrored current 122. As such, the leakage current 54 may track the mirrored current 122. In other words, the leakage current 54 may be independent of PVT variations.

Figure 5:
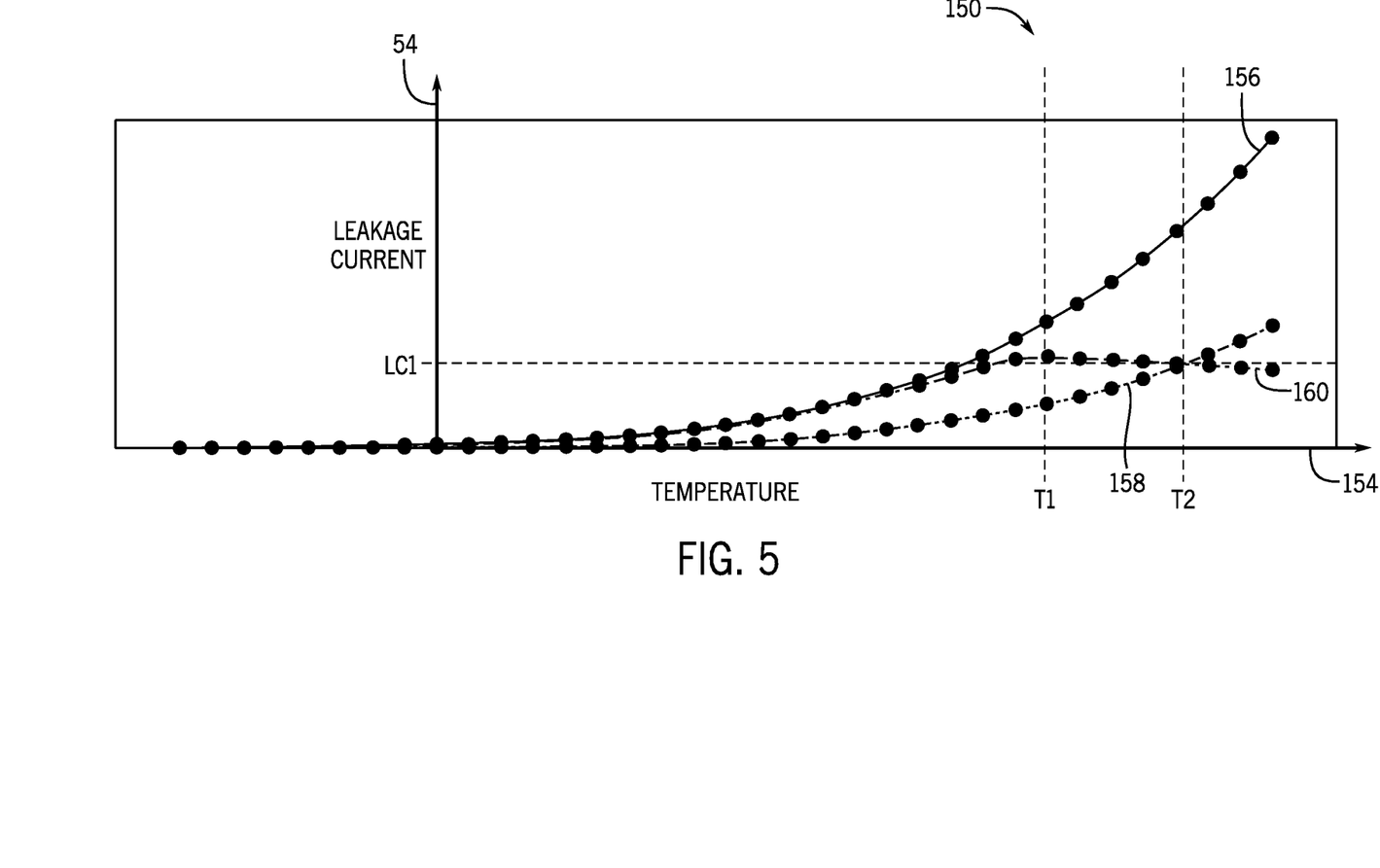
FIG. 5 is a graph of leakage current and temperature for the bulk voltage generation circuit, in accordance with an embodiment of the present disclosure.

FIG. 5 illustrates a graph 150 of the leakage current 54 and temperature 154 for example embodiments of the bulk voltage generation circuit, in accordance with an embodiment of the present disclosure. Line 156 represents the leakage current 54 for the PMOS transistor 52 of FIG. 2 with the bulk voltage 43 for the PMOS transistor 52 of FIG. 2 being equal to the power supply potential provided by the power supply terminal 25. As shown, the leakage current 54 for line 156 continues to increase with the temperature 154.

Line 158 represents the leakage current 54 for the PMOS transistor 52 of FIG. 3 with the bulk voltage 43 for the PMOS transistor 52 of FIG. 3 set at a constant level greater than the power supply potential provided by the power supply terminal 25. As shown, the leakage current 54 for the line 158 is lower than the leakage current 54 for the line 156 due to the higher bulk voltage potential applied to the PMOS transistor 52 of FIG. 3. However, and as discussed above, the leakage current 54 for the line 158 continues to increase with increased temperature and/or process variations.

Line 160 represents the leakage current 54 for the PMOS transistor 52 of FIG. 4 with the bulk voltage 43 for the PMOS transistor 52 of FIG. 4 varying between the power supply potential provided by the power supply terminal 25 and the power supply potential 92 based on leakage current 54 compared to a PVT-independent current. As shown, the leakage current 54 of line 160 increases along with the temperature until the temperature of the PMOS transistor 52 reaches a first temperature T1. The leakage current 54 may be greater than the bandgap current when the PMOS transistor 52 is at or above the first temperature. As such, the bulk voltage generator circuit 42 (e.g., voltage generator circuitry 106 in FIG. 4) may provide the bulk voltage 43 at a potential greater than the power supply potential provided by the power supply terminal 25 and up to the power supply potential 92. Accordingly, the leakage current 54 of line 160 then decreases and settles around a first leakage current LC1. In some embodiments, the first leakage current LC1 may be substantially equal to the mirrored current 122. As shown, the leakage current 54 of the line 158 may be greater than the leakage current 54 of the line 160 when the temperature of the PMOS transistor 52 passes a second temperature T2.

While FIG. 5 illustrates a graph of the leakage current 54 and the temperature 154, any PVT variation may be graphed with respect to the leakage current to show similar behaviors for the bulk voltage generation circuit 42. For example, a graph of the leakage current 54 and voltage may show the leakage current 54 plateauing above a particular voltage for the PMOS transistor 52 of FIG. 4 as the leakage current 54 continues to increase for the PMOS transistors 52 of FIGS. 2 and 3.

Embodiments of the present disclosure relate to dynamically adjusting the leakage current 54 regardless of PVT variations. The bulk voltage generation circuit 42 may enable automatic tracking of a PVT independent current generated by the bandgap circuit 40 thereby enabling mitigation of the leakage current across PVT variations.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An apparatus, comprising:
one or more power amplifiers configured to power components of the apparatus and comprising a transistor; and
bandgap current mirroring circuitry configured to generate a mirrored current that mirrors a received current that is process, voltage, and temperature (PVT) independent; and
a bulk voltage generator circuit, comprising:
an amplifier, wherein the bandgap current mirroring circuitry is coupled to an input terminal of the amplifier; and
bulk voltage control circuitry coupled to an output of the amplifier, wherein the bulk voltage control circuitry is configured to generate a bulk voltage based at least in part on a relationship between the mirrored current and a leakage current that leaks from the transistor.

2. The apparatus of claim 1, comprising a node coupled to the bandgap current mirroring circuitry and the transistor, wherein the node is configured to provide a feedback voltage to the input terminal of the amplifier based at least in part on the relationship between the mirrored current and the leakage current.

3. The apparatus of claim 2, wherein a second input terminal of the amplifier is configured to receive a reference voltage.

4. The apparatus of claim 1, wherein the leakage current is leaked from the transistor of the one or more power amplifiers when the transistor is in a turned-off mode.

5. The apparatus of claim 1, wherein the transistor comprises a P-channel metal-oxide-semiconductor (PMOS) transistor, wherein a gate terminal of the PMOS transistor and a source terminal of the PMOS transistor are coupled to a voltage supply, wherein a drain terminal of the PMOS transistor is coupled to the input terminal of the amplifier, wherein a bulk terminal of the PMOS transistor is coupled to the bulk voltage control circuitry, and wherein the bulk terminal is configured to receive the bulk voltage generated by the bulk voltage control circuitry.

6. The apparatus of claim 1, wherein the bandgap current mirroring circuitry comprises a N-channel metal-oxide-semiconductor (NMOS) transistor, wherein a gate terminal of the NMOS transistor is coupled to a voltage supply, wherein a drain terminal of the NMOS transistor is coupled to ground, and wherein a source terminal of the NMOS transistor is coupled to the input terminal of the amplifier.

7. The apparatus of claim 1, wherein the bulk voltage control circuitry comprises a P-channel metal-oxide-semiconductor (PMOS) transistor, wherein a source terminal of the PMOS transistor is coupled to a voltage supply, wherein a gate terminal of the PMOS transistor is coupled to the output of the amplifier, and wherein a drain terminal of the PMOS transistor is coupled to a bulk voltage terminal of the transistor.

8. The apparatus of claim 7, comprising a second voltage supply, wherein the bulk voltage comprises a voltage range between the voltage supply and the second voltage supply.

9. The apparatus of claim 8, wherein the voltage supply is greater than the second voltage supply.

10. Circuitry for generating a bulk voltage, comprising:
bandgap current mirroring circuitry configured to generate a mirrored current that mirrors a received current that is process, voltage, and temperature (PVT) independent; and
voltage generator circuitry coupled to the bandgap current mirroring circuitry, wherein the voltage generator circuitry is configured to generate the bulk voltage for a transistor based at least in part on a relationship between the mirrored current and a leakage current occurring when an electronic device is in a turn-off mode.

11. The circuitry of claim 10, comprising the transistor, wherein the leakage current comprises current flowing through a transistor when the electronic device is in the turn-off mode.

12. The circuitry of claim 11, wherein the transistor comprises a P-channel metal-oxide-semiconductor (PMOS) transistor, wherein a gate terminal of the PMOS transistor and a source terminal of the PMOS transistor are coupled to a voltage supply, wherein a drain terminal of the PMOS transistor is coupled to a feedback of the voltage generator circuitry, wherein a bulk terminal of the PMOS transistor is coupled to an output of the voltage generator circuitry, and wherein the bulk terminal is configured to receive the bulk voltage generated by the voltage generator circuitry.

13. The circuitry of claim 10, wherein the bandgap current mirroring circuitry comprises a N-channel metal-oxide-semiconductor (NMOS) transistor, wherein a gate terminal of the NMOS transistor is coupled to a voltage supply, wherein a drain terminal of the NMOS transistor is coupled to ground, and wherein a source terminal of the NMOS transistor is coupled to the voltage generator circuitry.

14. The circuitry of claim 10, wherein the voltage generator circuitry is configured to reduce the leakage current based on the relationship between the mirrored current and the leakage current when the leakage current exceeds the mirrored current.

15. A bulk voltage generation circuit, comprising:
bandgap current mirroring circuitry configured to generate a mirrored current that mirrors a received current that is process, voltage, and temperature (PVT) independent, wherein the mirrored current is configured to bleed charge from a node that is configured to receive charge from a leakage current of a transistor; and
voltage generator circuitry comprising:
an amplifier, wherein the node is coupled to an input of the amplifier; and
bulk voltage control circuitry coupled to an output of the amplifier, wherein the bulk voltage control circuitry is configured to generate the bulk voltage based at least in part on a relationship between the mirrored current and the leakage current.

16. The bulk voltage generation circuit of claim 15, wherein the transistor is part of one or more power amplifiers.

17. The bulk voltage generation circuit of claim 15, wherein the bulk voltage control circuitry comprises a P-channel metal-oxide-semiconductor (PMOS) transistor, wherein a source terminal of the PMOS transistor is coupled to a voltage supply, wherein a gate terminal of the PMOS transistor is coupled to the output of the amplifier, and wherein a drain terminal of the PMOS transistor is coupled to the a bulk terminal of the transistor to provide the bulk voltage to the transistor.

18. The bulk voltage generation circuit of claim 15, wherein the transistor comprises a P-channel metal-oxide-semiconductor (PMOS) transistor, wherein a gate terminal of the PMOS transistor and a source terminal of the PMOS transistor are coupled to a voltage supply, wherein a drain terminal of the PMOS transistor is coupled to the node, wherein a bulk terminal of the PMOS transistor is coupled to the bulk voltage control circuitry, and wherein the bulk terminal is configured to receive the bulk voltage generated by the bulk voltage control circuitry.

19. The bulk voltage generation circuit of claim 18, wherein the bulk voltage is equal to or greater than the voltage supply.

20. The bulk voltage generation circuit of claim 18, wherein the bulk voltage control circuitry is configured to generate the bulk voltage greater than the voltage supply when the leakage current is greater than the mirrored current.

\* \* \* \* \*